(12) United States Patent
Zheng et al.

(10) Patent No.: US 7,084,036 B2
(45) Date of Patent: Aug. 1, 2006

(54) DATA WRITING METHOD FOR MASK READ ONLY MEMORY

(75) Inventors: Yuan-Wei Zheng, Shanghai (CN); Meng-Yu Pan, Shanghai (CN); Julian Chang, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 10/972,458

(22) Filed: Oct. 26, 2004

(65) Prior Publication Data

US 2005/0090065 A1 Apr. 28, 2005

(30) Foreign Application Priority Data

Oct. 27, 2003 (CN) .................... 2003 1 0108196

(51) Int. Cl.
*H01L 21/8236* (2006.01)

(52) U.S. Cl. ...................... 438/278; 438/290

(58) Field of Classification Search ........ 438/275–279, 438/289–291
See application file for complete search history.

(56) References Cited

U.S. PATENT DOCUMENTS

| 6,180,463 B1 * | 1/2001 | Otsuki ..................... 438/278 |
| 6,184,094 B1 * | 2/2001 | Goto ........................ 438/276 |

* cited by examiner

*Primary Examiner*—Richard A. Booth
(74) *Attorney, Agent, or Firm*—Rosenberg, Klein & Lee

(57) ABSTRACT

A data writing method for mask read only memory using different doses of ion implantations to perform the data writing of Mask Read Only Memory. A semiconductor substrate having a plurality of gate structures is provided. The different ion implantations are performed depending on the mask from the user, thereby generating the different voltage output values. The different voltage output values are set as (00), (01), (10), and (11) for the bit output. Therefore, the present invention reduces the area of memory required for a specific data record, and lowers the production cost.

7 Claims, 7 Drawing Sheets

DATA WRITING METHOD FOR MASK READ ONLY MEMORY

BACKGROUND OF THE INVENTION

1. Field of the Invention

The present invention relates to a data writing method for Mask Read Only Memory, and more particularly to a Mask Read Only Memory using doses of four different ion implantations as the bit data writing method.

2. Description of the Prior Art

Mask Read Only Memory (MROM) is one type of memory IC. MROM is a memory device that uses the mask to program in LSI (large-scale integrated circuit) chip processing.

Since writing is not necessary, the entire circuit becomes simpler. The basic memory cell also becomes simpler and comprises one MOS transistor. Compared with Random Access Memory (RAM) which allows memory data to be continuously changed, the size of MOS is only a fourth of RAM. For chips with the same size, the memory capacity of MROM is about four times that of RAM. It is an economical method applied in various electronic productions.

The data writing is completed depending on the mask from the user. In order to shorten the TAT (Turn Around Time), the program is usually performed during chip processing. However, the memory cell has a larger area, so that the costs disadvantageously increase.

Therefore, a data writing method for Mask Read Only Memory is provided to overcome the above-mentioned disadvantages, which reduces the required cell area and lowers the bit cost and the size of die under the condition of required density.

SUMMARY OF THE INVENTION

The present invention provides a data writing method for Mask Read Only Memory, in which the area of memory cell is effectively reduced.

The present invention also provides a data writing method for Mask Read Only Memory, in which the size of die is effectively reduced for greater density and lower cost.

To achieve the aforementioned objects, an embodiment of the present invention provides a data writing method for Mask Read Only Memory comprising: providing a semiconductor substrate having a plurality of gate structures; forming a patterned first photoresist layer on the semiconductor substrate, wherein the patterned first photoresist layer covers the gate structures to expose a first code area; performing a first ion implantation step on the first code area using the patterned first photoresist layer as a mask, removing the patterned first photoresist layer; forming a patterned second photoresist layer on the semiconductor substrate, wherein the patterned second photoresist layer covers the gate structures and the first code area to expose a second code area; performing a second ion implantation step on the second code area using the patterned second photoresist layer as a mask, removing the patterned second photoresist layer; forming a patterned third photoresist layer on the semiconductor substrate, wherein the patterned third photoresist layer covers the gate structures, the first code area and the second code area to expose a third code area; performing a third ion implantation step on the third code area using the patterned third photoresist layer as a mask, removing the patterned third photoresist layer; forming a patterned fourth photoresist layer on the semiconductor substrate, wherein the patterned fourth photoresist layer covers the gate structures, the first code area, the second code area and the third code area to expose a fourth code area; performing a fourth ion implantation step on the fourth code area using the patterned fourth photoresist layer as a mask; and removing the patterned fourth photoresist layer to complete the data writing.

The present invention also provides a data writing method for Mask Read Only Memory comprising: a semiconductor substrate having a plurality of gate structures thereon; forming a patterned photoresist layer on the semiconductor substrate to expose a first code area and a fourth code area; performing a first ion implantation step using the patterned first photoresist layer, and removing the patterned first photoresist layer; forming a patterned second photoresist layer on the semiconductor substrate, wherein the patterned second photoresist layer covers the gate structures and the first code area to expose a second code area and the fourth code area; performing a second ion implantation step using the patterned second photoresist layer as a mask, and removing the patterned second photoresist layer; forming a patterned third photoresist layer on the semiconductor substrate to cover the gate structures, the first code area, the second code area, and the fourth code area to expose a third code area; performing a third ion implantation step using the patterned third photoresist layer as a mask, and removing the patterned third photoresist layer to complete the data writing.

These and other objectives of the present invention will become obvious to those of ordinary skill in the art after reading the following detailed description of the preferred embodiment.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

The present invention provides a data writing method for mask read only memory, which uses four doses of different ion implantations to generate the voltage values for four different memory cells used as the bit data writing method.

Figure 1A:
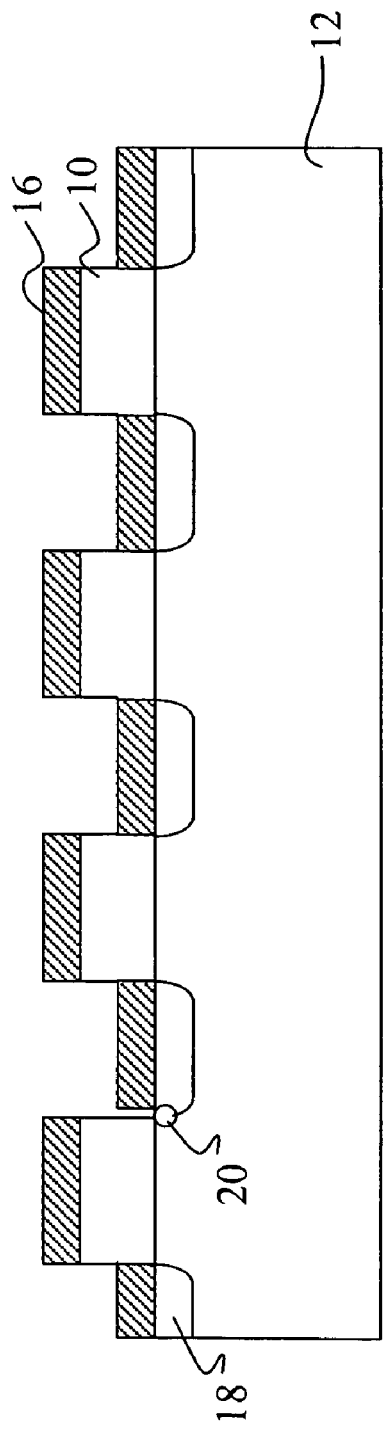
FIGS. 1a through 1d are sectional diagrams illustrating using four masks for performing data writing according to a preferred embodiment of the present invention.
Figure 2A:
FIGS. 2a through 2d respectively are the patterns of four masks for performing data writing according to a preferred embodiment of the present invention.

Refer to FIG. 1a, a first photoresist layer is coated on the surface of the semiconductor substrate 12 having a plurality of gate structures 10 formed thereon. A first mask 14, as shown in FIG. 2a, is used to perform an exposure on the first photoresist layer to form a patterned first photoresist layer 16. The patterned first photoresist layer 16 covers the gate structures 10 to expose a first code area. Using the patterned first photoresist layer 16 as an implantation mask, a first ion implantation step is then performed to form a first ion implantation area 20, as the structure shown in FIG. 1a. The patterned first photoresist layer 16 is then removed.

Figure 1B:
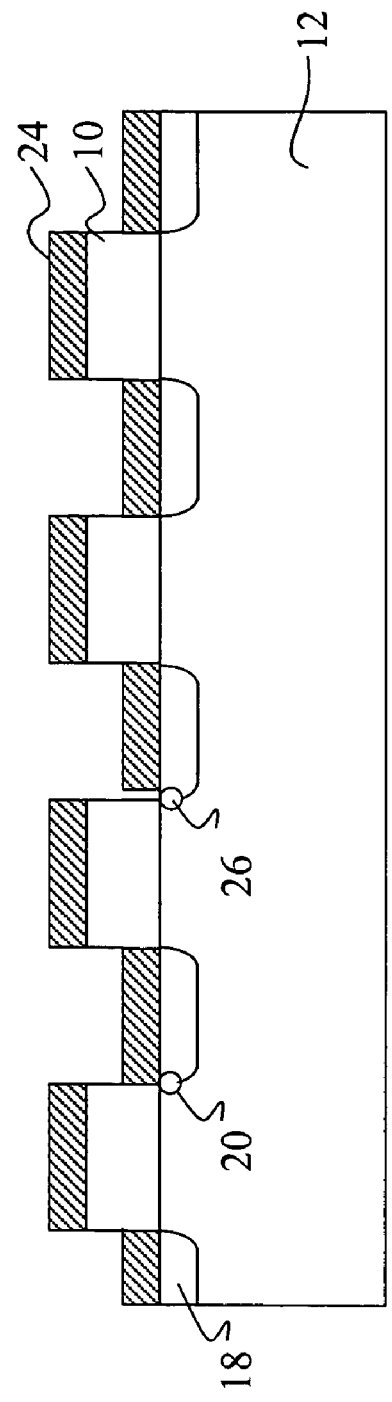
Figure 2B:
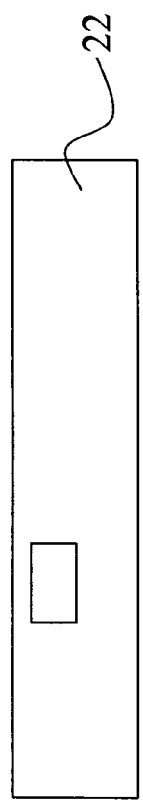

A patterned second photoresist layer 24 is formed on the semiconductor substrate 12 by using a second mask 22 of FIG. 2b, as shown in FIG. 1b. The patterned second photoresist layer 24 covers the gate structures 10 and the first code area to expose a second code area. Using the patterned second photoresist layer 24 as an implantation mask, a second ion implantation step is performed to form a second ion implantation area 26 on the gate channel 18, as the structure shown in FIG. 1b. The patterned second photoresist layer 24 is then removed.

Figure 1C:
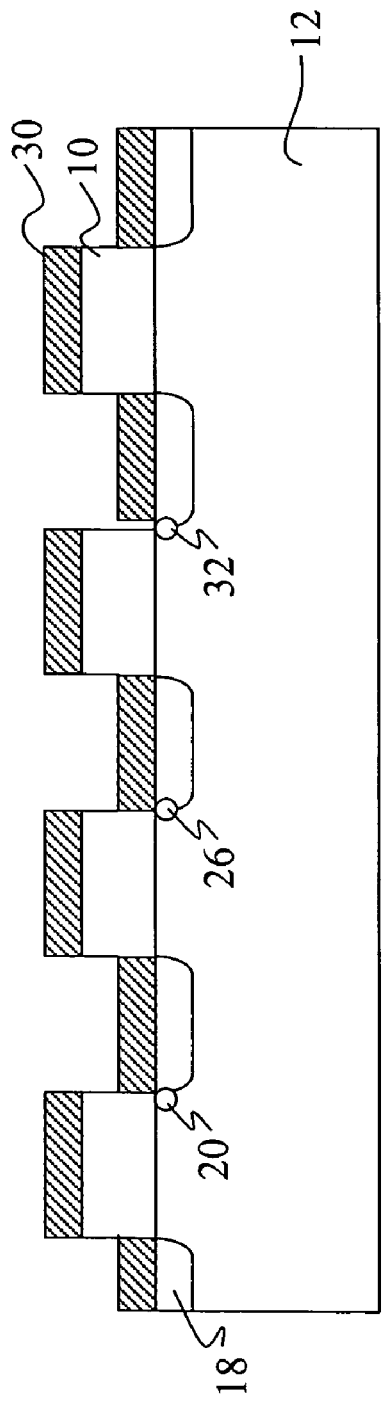
Figure 2C:
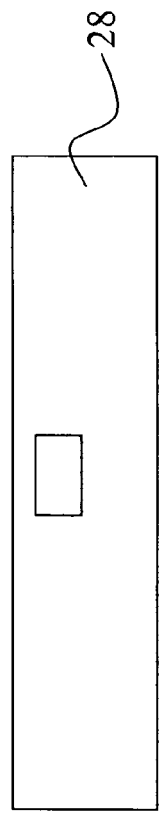

A patterned third photoresist layer 30 is formed on the semiconductor substrate 12 by using a third mask 28 of FIG. 2c, as shown in FIG. 1c. The patterned third photoresist layer 30 covers the gate structures 10, the first code area and the second code area to expose a third code area. Using the patterned third photoresist layer 30 as an implantation mask, a third ion implantation step is performed to form a third ion implantation area 32 on the gate channel 18, as the structure shown in FIG. 1c. The patterned third photoresist layer 30 is then removed.

Figure 1D:
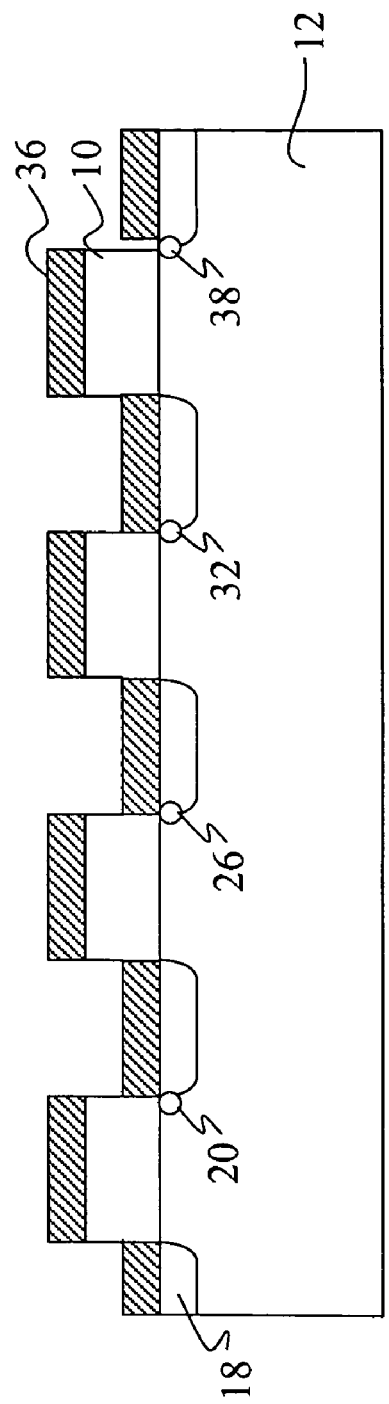
Figure 2D:
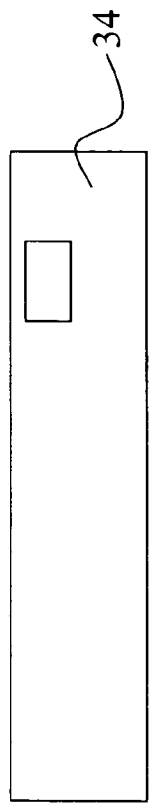

A patterned fourth photoresist layer 36 is formed on the semiconductor substrate 12 by using a fourth mask 34 of FIG. 2d, as shown in FIG. 1d. The patterned fourth photoresist layer 36 covers the gate structures 10, the first code area, the second code area, and third code area to expose a fourth code area. Using the patterned fourth photoresist layer 36 as an implantation mask, a fourth ion implantation step is performed to form a fourth ion implantation area 38 on the gate channel 18. The patterned fourth photoresist layer 36 is then removed to complete the data writing process.

Figure 3:
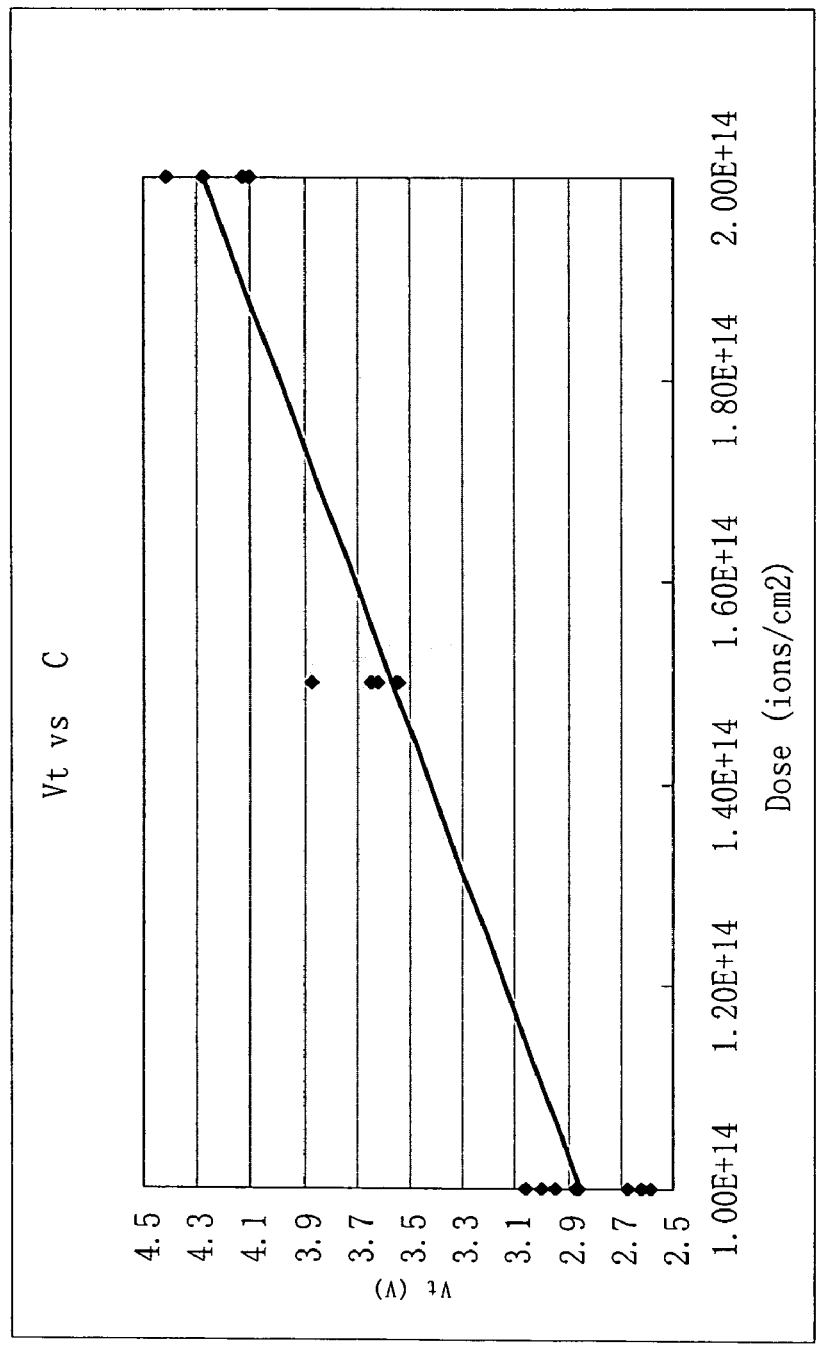
FIG. 3 is a graph of the relative voltage variation using the different ion implantations according to a preferred embodiment of the present invention.

When performing the first ion implantation step, the dose of the first ion implantation is $1.00E+14/cm^2$ and the obtained threshold voltage is 2.9 Vt. The dose of the second ion implantation is $1.50E+14/cm^2$ and the obtained threshold voltage is 3.6 Vt. The dose of the third ion implantation is $2.00E+14/cm^2$ and the obtained threshold voltage is 4.3 Vt. The dose of the fourth ion implantation is selected from any two doses of ion implantation. Therefore, the different voltages are obtained depending on the different doses as shown in FIG. 3. (01), (10), (11), (00) bits sequence are set depending on the different voltages.

Figure 4A:
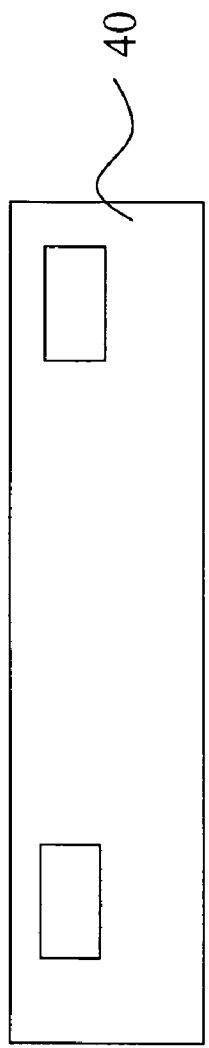
FIGS. 4a through 4c respectively are the patterns of three masks for performing data writing according to another preferred embodiment of the present invention.
Figure 4B:
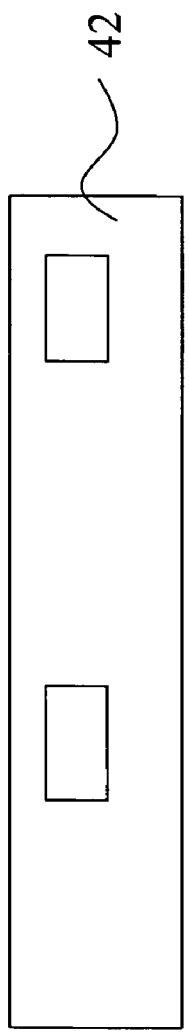
Figure 4C:
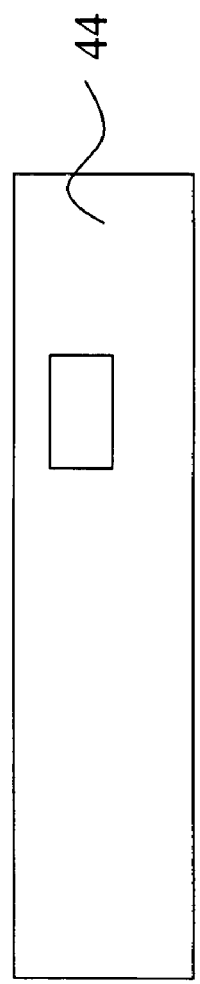

When the dose of the fourth ion implantation is the sum of the dose of the first ion implantation and the dose of the second ion implantation together, the fourth mask is designed into the first mask and the second mask, as shown as first mask 40 of FIG. 4a, a second mask 42 of FIG. 4b, and a third mask 44 of FIG. 4c.

Figure 5A:
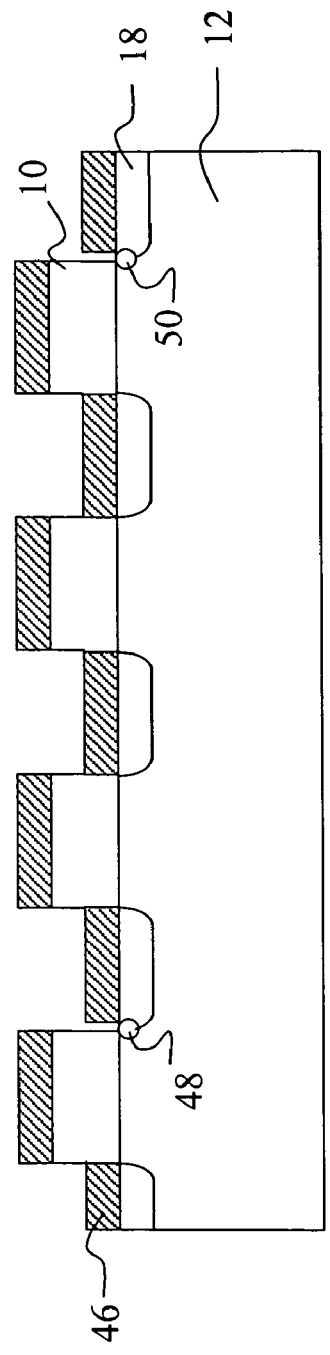
FIGS. 5a through 5c are sectional diagrams illustrating using three masks for performing data writing according to another preferred embodiment of the present invention.

For this type, the present invention provides another data writing method. A first photoresist layer 46 is coated on the surface of the semiconductor substrate 12 having a plurality of gate structures 10 formed thereon, as shown in FIG. 5a. A first mask 40, as shown in FIG. 5a, is used to form a patterned first photoresist layer 46. The patterned first photoresist layer 46 covers the gate structures 10 to expose a first code area and a fourth code area. Using the patterned first photoresist layer 46 as an implantation mask, a first ion implantation step is then performed to form a first ion implantation area 48 and a fourth ion implantation area 50 on the gate channel. The patterned first photoresist layer 46 is then removed.

Figure 5B:
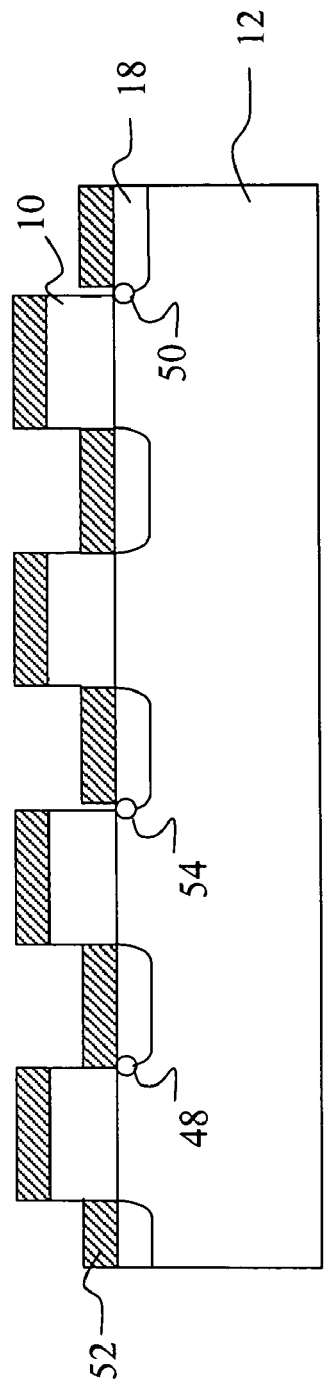

A patterned second photoresist layer 52 is formed on the semiconductor substrate 12 by using a second mask 42 of FIG. 4b, as shown in FIG. 5b. The patterned second photoresist layer 52 covers the gate structures 10 and the first code area to expose a second code area and a fourth code area. Using the patterned second photoresist layer 52 as an implantation mask, a second ion implantation step is performed to form a second ion implantation area 54 on the gate channel 18, and a fourth ion implantation area 50 added by the dose of the second ion implantation. The patterned second photoresist layer 52 is then removed.

Figure 5C:
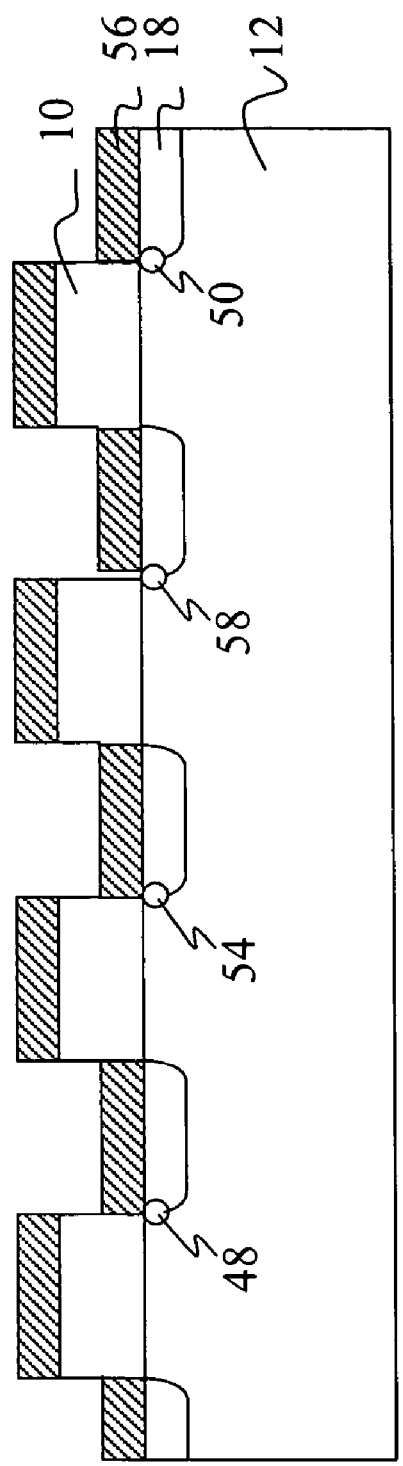

A patterned third photoresist layer 56 is formed on the semiconductor substrate 12 by using a third mask 44 of FIG. 4c, as shown in FIG. 5c. The patterned third photoresist layer 56 covers the gate structure 10, the first code area, the second code area, and the fourth code area to expose a third code area. Using the patterned third photoresist layer 56 as an implantation mask, a third ion implantation step is performed to form a third ion implantation area 56 on the gate channel 18. The patterned third photoresist layer 56 is then removed to complete the data writing process.

According to the present invention, a data writing method for mask read only memory is provided, useing doses of ion implantation to set the different voltage values used as the (01), (10), (00), and (11) dual bit storage method, thereby reducing the area of the entire chip and lowering the production cost in order to accelerate the data reading speed.

The embodiment above is only intended to illustrate the present invention; it does not, however, to limit the present invention to the specific embodiment. Accordingly, various modifications and changes may be made without departing from the spirit and scope of the present invention as described in the following claims.

What is claimed is:

1. A data writing method for Mask Read Only Memory, comprising:

a semiconductor substrate having a plurality of gate structures thereon;

forming a patterned first photoresist layer on the semiconductor substrate, wherein the patterned first photoresist layer covers the gate structures to expose a first code area and a fourth code area;

performing a first ion implantation step using the patterned first photoresist layer as a mask, removing the patterned first photoresist layer;

forming a patterned second photoresist layer on the semiconductor substrate, wherein the patterned second photoresist layer covers the gate structures and the first code area to expose a second code area and the fourth code area;

performing a second ion implantation step using the patterned second photoresist layer as a mask, removing the patterned second photoresist layer;

forming a patterned third photoresist layer on the semiconductor substrate, wherein the patterned third photoresist layer covers the gate structures, the first code area, the second code area and the fourth code area to expose a third code area;

performing a third ion implantation step using the patterned third photoresist layer as a mask; and removing the patterned third photoresist layer.

2. The data writing method for mask read only memory of claim 1, wherein the dose of the first ion implantation is $1.00E+14/cm^2$.

3. The data writing method for mask read only memory of claim 1, wherein the dose of the second ion implantation is $1.50E+14/cm^2$.

4. The data writing method for mask read only memory of claim 1, wherein the dose of the third ion implantation is $2.00E+14/cm^2$.

5. The data writing method for mask read only memory of claim 1, wherein in performing the first ion implantation, an ion of the first ion implantation is implanted into a gate channel.

6. The data writing method for mask read only memory of claim 1, wherein in performing the second ion implantation, an ion of the second ion implantation is implanted into a gate channel.

7. The data writing method for mask read only memory of claim 1, wherein in performing the third ion implantation, an ion of the third ion implantation is implanted into a gate channel.

* * * * *